United States Patent
Chiang et al.

(10) Patent No.: US 7,333,173 B2
(45) Date of Patent: Feb. 19, 2008

(54) METHOD TO SIMPLIFY TWIN STAGE SCANNER OVL MACHINE MATCHING

(75) Inventors: Shun-Jiang Chiang, Shanhua Township, Tainan County (TW); Chi-Hung Liao, Changlong (TW); Heng-Hsin Liu, Yonghe (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/818,582

(22) Filed: Apr. 6, 2004

(65) Prior Publication Data

US 2005/0219484 A1 Oct. 6, 2005

(51) Int. Cl.
*G03B 27/42* (2006.01)
*G03B 27/32* (2006.01)

(52) U.S. Cl. .......................... 355/53; 355/77

(58) Field of Classification Search ............. 355/53, 355/77, 52, 55; 430/22, 30, 311, 31; 356/399
See application file for complete search history.

(56) References Cited

U.S. PATENT DOCUMENTS

| | | | |
|---|---|---|---|
| 5,498,500 A * | 3/1996 | Bae ............................. 430/22 |
| 5,978,085 A | 11/1999 | Smith et al. ................ 356/354 |
| 6,489,068 B1 * | 12/2002 | Kye ............................ 430/22 |
| 6,535,774 B1 | 3/2003 | Bode et al. ................. 700/109 |
| 6,697,698 B2 * | 2/2004 | Yoshitake et al. .......... 700/124 |
| 6,841,321 B2 * | 1/2005 | Matsumoto et al. .......... 430/30 |
| 2003/0021467 A1 * | 1/2003 | Adel et al. .................. 382/151 |
| 2003/0036007 A1 | 2/2003 | Baggenstoss ................ 430/30 |
| 2003/0087192 A1 | 5/2003 | Gau et al. .................... 430/311 |
| 2003/0097198 A1 | 5/2003 | Sonderman et al. ........ 700/110 |
| 2003/0160960 A1 * | 8/2003 | Noguchi et al. ............. 356/401 |
| 2003/0186141 A1 * | 10/2003 | Park et al. .................... 430/22 |
| 2005/0117154 A1 * | 6/2005 | McArthur et al. .......... 356/401 |
| 2005/0193362 A1 * | 9/2005 | Phan et al. .................... 716/19 |

\* cited by examiner

*Primary Examiner*—Henry Hung Nguyen

(57) ABSTRACT

Multiple scanner or stepper machines are provided. A photoresist layer is coated on a monitor wafer. The photoresist layer is exposed through a mask pattern on a first of the multiple machines. The mask pattern is shifted by an offset and the photoresist layer is exposed through the mask pattern on another of the multiple machines. The shifting and exposing steps are continued for each of the multiple machines. A pattern on the monitor wafer is measured using an overlay measurement tool. Machine constants for each machine except the first machine of the multiple machines are updated based on results of the measuring to provide overlay control machine matching.

11 Claims, 2 Drawing Sheets

METHOD TO SIMPLIFY TWIN STAGE SCANNER OVL MACHINE MATCHING

FIELD OF THE INVENTION

The present invention relates generally to an improved method of overlay control machine matching and more specifically to a method for machine matching overlay control having cost and time savings.

BACKGROUND OF THE INVENTION

One quality characteristic of the photolithography process is critical dimension (CD). According to physical knowledge, CD is a function of the input recipe and the exposure dose (E). The increment or decrement of the exposure dose will lead to a proportional change in CD. Another quality characteristic of the photolithography process is overlay. Overlay control involves measuring misalignment between two successive patterned layers on the surface of a semiconductor device. Overlay depends upon many parameters, such as rotation, translation in the x- and y-axes, magnification, and so on. An additional factor in overlay control is machine matching. Often, it is not possible to use a single machine such as a scanner or stepper to expose all critical layers. For example, in order to avoid contamination of layers, semiconductor devices using copper employ one scanner or stepper for front-end processes and another scanner or stepper for back-end processes. In another example, a twin stage scanner may be used. A twin stage scanner has two wafer chucks. A single wafer may be processed on both chucks. It is necessary to match the overlay alignment between machines or between separate chucks on the same machine.

For example, in a conventional process, a monitor wafer is prepared. A first photoresist layer is exposed on the first machine and patterned (silicon wafer need etched). A second photoresist layer is then exposed on a second machine. A number of alignment marks were exposed on the first photoresist layer on the first machine. By shifting some distance in the X or Y direction, the same patterns were exposed on the second machine with the same photo-resist. By measuring all these alignment marks on the scanner, we can calculate the position error between the first and second layers which represents the overlay error between the two machines or the two chucks. This may take 60 minutes of scanner machine time to read all the alignment mark data. The data is modeled and then used to update the machine constants on the second machine so that the second machine is aligned to the first machine. One etched monitor wafer is needed for each machine or chuck, resulting in a higher production cost. Machine time for reading the data is significant.

U.S. Pat. No. 6,489,068 to Kye reveals a method for checking overlay error between two masks where overlay error is determined by observing darkness characteristics of alignment marks using the naked eye. U.S. Pat. No. 6,535,774 to Bode et al discloses modeling a disturbance in overlay control to modify input parameters to a scanner or stepper. U.S. Pat. No. 5,978,085 to Smith et al describes a method of measurement for correction of an optical system. U.S. Patent Application 2003/0097198 to Sonderman et al discloses a feed-forward correction method using an integrated metrology tool where errors in overlay control are compensated for in subsequent steps. U.S. Patent Application 2003/0087192 to Gau et al, assigned to the same assignee as the present invention, teaches the use of a single tool for all critical dimension patterning steps on a wafer so that machine matching is unnecessary. U.S. Patent Application 2003/0036007 to Baggenstoss teaches correction of a pattern on a mask to compensate for overlay error.

SUMMARY OF THE INVENTION

Accordingly, it is an object of the present invention to provide an improved method for overlay control machine matching.

Another object of the present invention is to provide a simplified method for overlay control machine matching.

A further object of the invention is to provide a simplified method for overlay control machine matching where a first layer of a monitor wafer is exposed on a first machine and a second layer of the monitor wafer is exposed on a second machine by shifting all images by an offset.

Yet another object of the invention is to provide a simplified method for overlay control machine matching where results are modeled by an overlay metrology tool to avoid using valuable machine time for gathering data.

Still another object of this invention is to provide a simplified method for overlay control machine matching where a first layer of a monitor wafer is exposed on a first machine and a second layer of the monitor wafer is exposed on a second machine by shifting all images by an offset where results are modeled by an overlay metrology tool to avoid using valuable machine time for gathering data.

According to the objects of the invention, an improved method for overlay control machine matching is achieved. Multiple scanner or stepper machines are provided. A photoresist layer is coated on a monitor wafer. The photoresist layer is exposed through a mask pattern on a first of the multiple machines. The mask pattern is shifted by an offset and the photoresist layer is exposed through the mask pattern on another of the multiple machines. The shifting and exposing steps are continued for each of the multiple machines. A pattern on the monitor wafer is measured using an overlay measurement tool. Machine constants for each machine except the first machine of the multiple machines are updated based on results of the measuring to provide overlay control machine matching.

BRIEF DESCRIPTION OF THE DRAWINGS

The present invention will be more clearly understood from the following description taken in conjunction with the accompanying drawings in which like reference numerals designate similar or corresponding elements, regions and portions in which.

DETAILED DESCRIPTION OF THE PREFERRED EMBODIMENTS

The process of the present invention provides a method for simplifying machine matching overlay control over multiple machines or over multiple chucks in a single machine. A monitor wafer is used for overlay control. A photoresist layer on the monitor wafer is exposed on one scanner or stepper machine by aligning two alignment marks. Without developing the photoresist or etching the wafer, a second layer with the same photoresist layer is exposed on a second machine by shifting all images an offset in the x-direction or in the y-direction. Results are modeled by an overlay metrology tool. This saves scanner read out machine time. The process can be used on a twin stage machine by exposing the first time on one chuck and exposing the second time on the other chuck.

Figure 1:
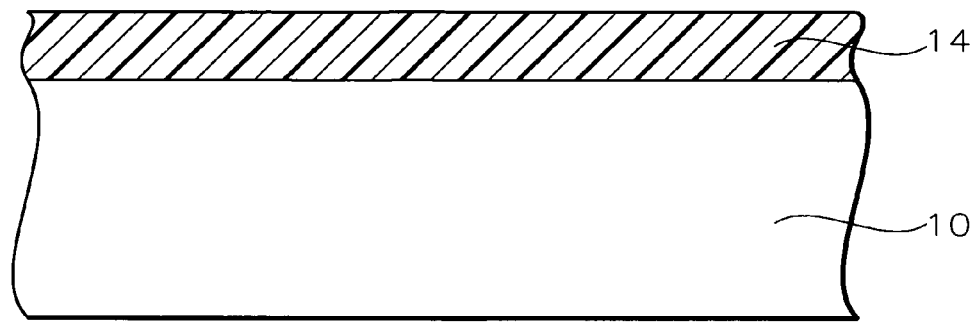
FIG. 1 illustrates in cross-sectional representation a monitor wafer of the present invention.
Figure 3:
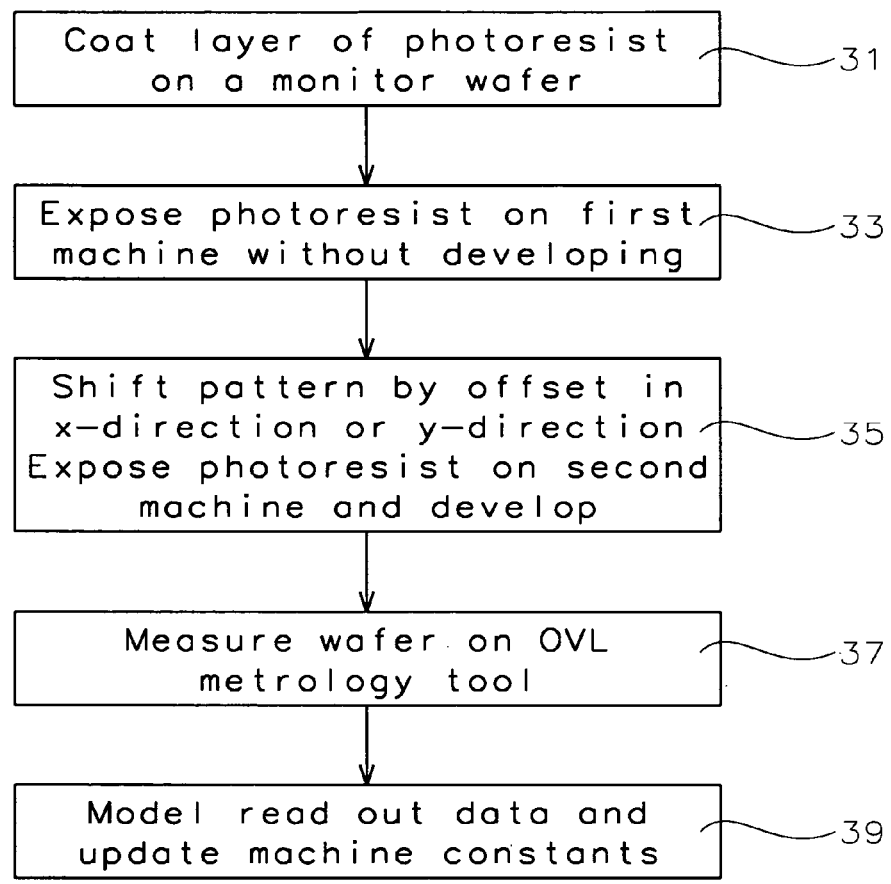
FIG. 3 is a flowchart of the process of the present invention.

FIG. 1 illustrates a portion of a monitor wafer 10. A layer of photoresist 14 has been coated on the monitor wafer. FIG. 3 illustrates a flow chart of the process of the invention. The monitor wafer is prepared in step 31. In step 33, the photoresist layer is exposed on the first machine or on the first chuck of a multiple stage machine. The photoresist layer is baked to fix the pattern in the layer. Developing is not performed.

Now, in step 35, the photoresist layer is exposed on the second machine or the second chuck by shifting the wafer by an offset in the x-direction or in the y-direction. For example, the wafer may be shifted 40 µm. The same photoresist layer 14 is exposed the second time. No additional photoresist coating is performed. The photoresist layer is baked and then developed.

Figure 2:
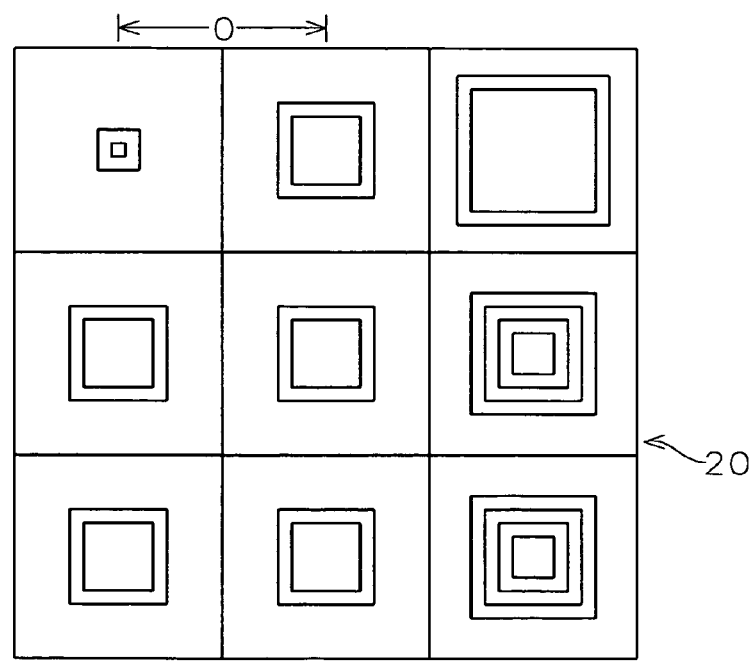
FIG. 2 illustrates a top view of a monitor mask of the present invention.

FIG. 2 shows the box in box pattern 20 for the overlay (OVL) monitor in the monitor mask. The offset O is shown. For example, the offset might be 40 µm. The overlay metrology tool uses the box in box pattern to measure the overlay error between the two machines (step 37). In the prior art, alignment marks are read by the scanner, taking up a lot of machine time. Using the overlay metrology tool to measure the overlay error saves machine time.

Finally, in step 39, the read out data is modeled and updated machine constants are applied to the second machine to insure overlay control machine matching between the machines. If more than two machines are used or if the multiple stage machine has more than two chucks, the wafer will be exposed additional times at additional offsets for each machine or stage to be matched.

In the prior art, a number of monitor wafers must be prepared. For example, a monitor wafer is prepared by exposing the first layer on the "golden" machine (that is, the first machine). Then the wafer is etched. This wafer is used as the "golden" wafer to match all the other machines. Since this golden wafer might one day be broken, a number of golden wafers are prepared. However, the overlay (OVL) control of the golden machine is not good enough that all the prepared monitor wafers will have the same fingerprint after exposure on the golden machine. Perhaps only about 12 out of 50 wafers could be selected as monitor wafers and the others must be scrapped. However, using the process of the present invention, preparing multiple golden wafers is no longer needed since the monitor wafers do not need to be etched. The photoresist layer is exposed on the golden machine without developing, then the same layer is exposed on the second machine. There is no need to etch the wafer, so any wafer can be used.

The process of the present invention provides an effective, cost-saving method of overlay control machine matching.

While the present invention has been particularly shown and described with reference to the preferred embodiment thereof, it will be understood by those skilled in the art that various changes in form and detail may be made without departing from the spirit and scope of the invention.

What is claimed is:

1. A method for overlay control machine matching comprising:
    forming an exposure sensitive layer on a monitor substrate;
    exposing a first overlay mark on said exposure sensitive layer through a mask pattern of a first mask on a first exposure stage;
    shifting said mask pattern of said first mask by an offset and exposing a second overlay mark on said exposure sensitive layer through said mask pattern of said first mask shifted by said offset, on a second exposure stage;
    developing said first and second overlay marks on said substrate;
    measuring an overlay error between said first and second overlay marks using an overlay metrology equipment that performs said measuring; and
    updating machine constants for said second exposure stage based on said overlay error to provide said overlay control machine matching.

2. The method according to claim 1 wherein said first and second exposure stages are scanners or stepper machines.

3. The method according to claim 1 wherein said offset is about 40 µm in an x-direction or y-direction.

4. The method according to claim 1 wherein a box in box pattern is measured in said measuring step.

5. The method according to claim 1, wherein said exposure sensitive layer is a photoresist layer.

6. A method for overlay control machine matching comprising:
    providing a plurality of exposure stages;
    coating an exposure sensitive layer on a monitor substrate;
    exposing a first overlay mark on said exposure sensitive layer through a mask pattern of a first mask on a first exposure stage;
    shifting said mask pattern of said first mask by an offset and exposing a second overlay mark on said exposure sensitive layer through said mask pattern of said first mask shifted by said offset, on a second exposure stage;
    continuing said shifting of said mask pattern of said first mask by a corresponding offset and exposing an additional overlay mark on said exposure sensitive layer through said mask pattern of said first mask shifted by said corresponding overlay, for each additional exposure stage of said plurality of exposure stages;
    developing said first, second, and additional overlay marks on said substrate;
    measuring an overlay error between said first and second overlay marks and between said first overlay mark and each of said additional overlay marks using an overlay metrology equipment that performs said measuring; and
    updating machine constants for said second exposure stage and for each of said additional exposure stages based on said overlay error to provide said overlay control machine matching.

7. The method according to claim 6 wherein said plurality of exposure stages are multiple scanners or stepper machines.

8. The method according to claim 7, wherein said multiple scanners or stepper machines are multiple chucks of a single scanner or a stepper machine.

9. The method according to claim 6 wherein said offset is about 40 µm in an x-direction or Y direction.

10. The method according to claim 6 wherein a box in box pattern is measured in said measuring step.

11. The method according to claim 6, wherein said exposure sensitive layer is a photoresist layer.

* * * * *